US009991989B2

(12) United States Patent
Malladi et al.

(10) Patent No.: US 9,991,989 B2
(45) Date of Patent: Jun. 5, 2018

(54) SOFT HYBRID AUTOMATIC REPEAT REQUEST

(71) Applicant: QUALCOMM Incorporated, San Diego, CA (US)

(72) Inventors: Durga Prasad Malladi, San Diego, CA (US); Yongbin Wei, La Jolla, CA (US); Taesang Yoo, Riverside, CA (US); Siddhartha Mallik, San Diego, CA (US); Jing Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 15/173,206

(22) Filed: Jun. 3, 2016

(65) Prior Publication Data

US 2016/0380724 A1 Dec. 29, 2016

Related U.S. Application Data

(60) Provisional application No. 62/185,464, filed on Jun. 26, 2015.

(51) Int. Cl.
*H04L 1/00* (2006.01)
*H04L 1/18* (2006.01)
(Continued)

(52) U.S. Cl.
CPC .......... *H04L 1/0045* (2013.01); *H03M 13/45* (2013.01); *H04B 17/336* (2015.01);
(Continued)

(58) Field of Classification Search
CPC ... H04L 1/0045; H04L 1/1835; H04L 1/1812; H04L 1/1845; H04W 84/042; H03M 13/45; H04B 17/336
See application file for complete search history.

(56) References Cited

U.S. PATENT DOCUMENTS 8,611,399 B2 12/2013 Myers et al.
8,908,624 B2 12/2014 Sfar et al.
(Continued)

FOREIGN PATENT DOCUMENTS

EP 2663011 A1 11/2013

OTHER PUBLICATIONS

S. H. Kim, S. M. Kim and D. K. Sung, "Combining Data Aggregation and HARQ Schemes to Guarantee Quality-of-Services in Uplink Relay-Based Networks," 2010 IEEE International Conference on Communications, Cape Town, 2010, pp. 1-5.*
(Continued)

*Primary Examiner* — Cynthia Britt
(74) *Attorney, Agent, or Firm* — Holland & Hart LLP

(57) ABSTRACT

Methods, systems, and devices for soft hybrid automatic repeat request operation in wireless communication are described. A user equipment (UE) may fail to decode a received signal, for example. The UE may store a portion of the signal in a buffer if the signal size is greater than the buffer size; otherwise, the UE may store the entire signal in the buffer. The UE may then receive a second signal and combine the second signal with the stored portion of the first signal; the combined signal may be larger than the buffer size. This combined signal may, for example, have a code rate less than the first signal. The UE may perform a second decoding attempt on the combined signal. The UE may determine that the second decoding attempt failed and may store a portion of the combined signal in the buffer.

30 Claims, 12 Drawing Sheets

(51) Int. Cl.

| | |
|---|---|
| ***H04B 17/336*** | (2015.01) |
| ***H03M 13/45*** | (2006.01) |
| ***H04W 84/04*** | (2009.01) |

(52) U.S. Cl.

CPC .......... *H04L 1/1812* (2013.01); *H04L 1/1835* (2013.01); *H04L 1/1845* (2013.01); *H04W 84/042* (2013.01)

(56) References Cited

U.S. PATENT DOCUMENTS

| | | | | |
|---|---|---|---|---|
| 9,204,437 | B2 | 12/2015 | Smee et al. | |
| 9,225,476 | B2 | 12/2015 | Mueller-Weinfurtner et al. | |
| 2009/0037797 | A1 | 2/2009 | Spencer et al. | |
| 2009/0135965 | A1 | 5/2009 | Shen et al. | |
| 2012/0300699 | A1 | 11/2012 | Karnuf et al. | |
| 2013/0121216 | A1 | 5/2013 | Chen et al. | |
| 2013/0290806 | A1* | 10/2013 | Zhang | G11B 20/1833 714/752 |
| 2014/0136917 | A1* | 5/2014 | Patapoutian | G11B 20/10527 714/752 |
| 2014/0177643 | A1* | 6/2014 | Finney | G06F 9/3885 370/412 |
| 2015/0009872 | A1* | 1/2015 | Yang | H04J 3/00 370/280 |
| 2016/0050049 | A1 | 2/2016 | Yang et al. | |

OTHER PUBLICATIONS

S. Park and S. Choi, "Performance of Symbol-Level Combining and Bit-Level Combining in MIMO Multiple ARQ Systems," in IEEE Transactions on Communications, vol. 64, No. 4, pp. 1517-1528, Apr. 2016.*

Y. Gao, G. Li, K. Chen and X. Wu, "A Novel HARQ Scheme Utilizing the Iterative Soft-information Feedback in MIMO System," 2007 IEEE 65th Vehicular Technology Conference—VTC2007—Spring, Dublin, 2007, pp. 423-424.*

ISA/EP, International Search Report and Written Opinion of the International Searching Authority, Int'l Application No. PCT/US2016/036016, dated Sep. 22, 2016, European Patent Office, Rijswijk, NL, 12 pgs.

* cited by examiner

SOFT HYBRID AUTOMATIC REPEAT REQUEST

CROSS REFERENCES

The present Application for Patent claims priority to U.S. Provisional Patent Application No. 62/185,464 by Malladi et al., entitled "Soft Hybrid Automatic Repeat Request," filed Jun. 26, 2015, assigned to the assignee hereof.

BACKGROUND

The following relates generally to wireless communication, and more specifically to soft hybrid automatic repeat request (HARQ) operation.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may be otherwise known as user equipment (UE).

Wireless communication may be subject to loss or distortion of packets during transmission, which may result in a failure to decode packets received by a UE. Some wireless systems may incorporate error-correction techniques to improve reliability. For example, a transmitter may repeatedly send a lost packet or some modified version of it. A receiver may combine the original packet with the newly received packet to improve the chances of successful packet decoding. This may require a data storage component, such as a buffer. As data transmission rates continue to increase, the buffer power usage and physical dimensions of the buffer may increase to support storage of the larger amounts of data associated with increased transmission rates.

SUMMARY

A user equipment (UE) may employ soft hybrid automatic repeat request (HARQ) techniques to limit the amount of data stored for error correction. A UE may, for example, receive a first signal and may fail to decode it. The UE may store the signal (e.g., packets or bits associated with the signal) in a buffer. The UE may store a portion of the signal if the signal size is greater than the buffer size; or the UE may store the entire signal if it is smaller than the buffer size. The UE may receive a second signal and may combine it with the stored (e.g., buffered) portion of the first signal; the combined signal may be larger than the buffer size. The UE may perform a second decoding attempt on the combined signal. If the second decoding attempt fails, the UE may store a portion of the combined signal in the buffer, rather than the entire combined signal, where the portion of the combined signal has a size less than or equal to the size of the buffer.

A method of wireless communication is described. The method may include receiving a first signal having a size that is greater than a size of a buffer, determining that a decoding attempt of the first signal failed, and storing a portion of the first signal in the buffer, the portion of the first signal having a size less than or equal to the size of the buffer and stored based at least in part on the determination that the decoding attempt of the first signal failed.

An apparatus for wireless communication is described. The apparatus may include means for receiving a first signal having a size that is greater than a size of a buffer, means for determining that a decoding attempt of the first signal failed, and means for storing a portion of the first signal in the buffer, the portion of the first signal having a size less than or equal to the size of the buffer and stored based at least in part on the determination that the decoding attempt of the first signal failed.

A further apparatus for wireless communication is described. The apparatus may include a processor, a buffer with a size, memory in electronic communication with the processor, and instructions stored in the memory and operable, when executed by the processor, to cause the apparatus to receive a first signal having a size that is greater than the size of the buffer, determine that a decoding attempt of the first signal failed, and store a portion of the first signal in the buffer, the portion of the first signal having a size less than or equal to the size of the buffer and stored based at least in part on the determination that the decoding attempt of the first signal failed.

A non-transitory computer-readable medium storing code for wireless communication is described. The code may include instructions executable to receive a first signal having a size that is greater than a size of a buffer, determine that a decoding attempt of the first signal failed, and store a portion of the first signal in the buffer, the portion of the first signal having a size less than or equal to the size of the buffer and stored based at least in part on the determination that the decoding attempt of the first signal failed.

Some examples of the method, apparatuses, or non-transitory computer-readable medium described herein may further include processes, features, means, or instructions for receiving a second signal, combining the second signal and the buffered portion of the first signal to form a combined signal having a size that is greater than the size of the buffer, and performing a second decoding attempt on the combined signal. Additionally or alternatively, some examples may include processes, features, means, or instructions for determining that the second decoding attempt of the combined signal failed, and storing a portion of the combined signal in the buffer based at least in part on the determination that the second decoding attempt failed, the portion of the combined signal having a size that is less than or equal to the size of the buffer. Additionally or alternatively, some examples may include processes, features, means, or instructions for identifying the size of the buffer.

In some examples of the method, apparatuses, or non-transitory computer-readable medium described herein, the stored portion of the combined signal comprises a systematic information portion and a first parity portion of the first signal or a second parity portion of the second signal, or both. Additionally or alternatively, in some examples the combined signal has a code rate that is less than a code rate of the first signal.

In some examples of the method, apparatuses, or non-transitory computer-readable medium described herein, the code rate of the first signal is less than one. Additionally or alternatively, in some examples combining the second signal and the stored portion of the first signal comprises soft-combining systematic information portions of the first and second signal.

In some examples of the method, apparatuses, or non-transitory computer-readable medium described herein, the combined signal comprises a systematic information portion, a first parity portion based at least in part on the first signal, and a second parity portion based at least in part on the second signal. Additionally or alternatively, in some examples the second signal is combined with the stored portion of the first signal without storing the second signal prior to the combining.

Some examples of the method, apparatuses, or non-transitory computer-readable medium described herein may further include processes, features, means, or instructions for receiving signaling indicative of whether the second signal comprises a systematic information portion or a parity portion, or both. Additionally or alternatively, some examples may include processes, features, means, or instructions for selecting the first portion of the first and second signals for storing based at least in part on a signal-to-noise ratio (SNR).

In some examples of the method, apparatuses, or non-transitory computer-readable medium described herein, selecting the portion of the first and second signals for storing comprises identifying one or both of a systematic information or parity portion for storing based at least in part on a relative SNR of the second signal and the first signal. Additionally or alternatively, in some examples the first signal comprises a coded information portion and parity portion.

In some examples of the method, apparatuses, or non-transitory computer-readable medium described herein, the buffer comprises a log-likelihood ratio (LLR) buffer. Additionally or alternatively, in some examples receiving the first signal comprises receiving a downlink data channel of a plurality of component carriers (CCs).

In some examples of the method, apparatuses, or non-transitory computer-readable medium described herein, the size of the buffer is less than a size of a system transport block size at a lowest code rate.

BRIEF DESCRIPTION OF THE DRAWINGS

Aspects of the disclosure are described in reference to the following figures.

DETAILED DESCRIPTION

Figure 1:
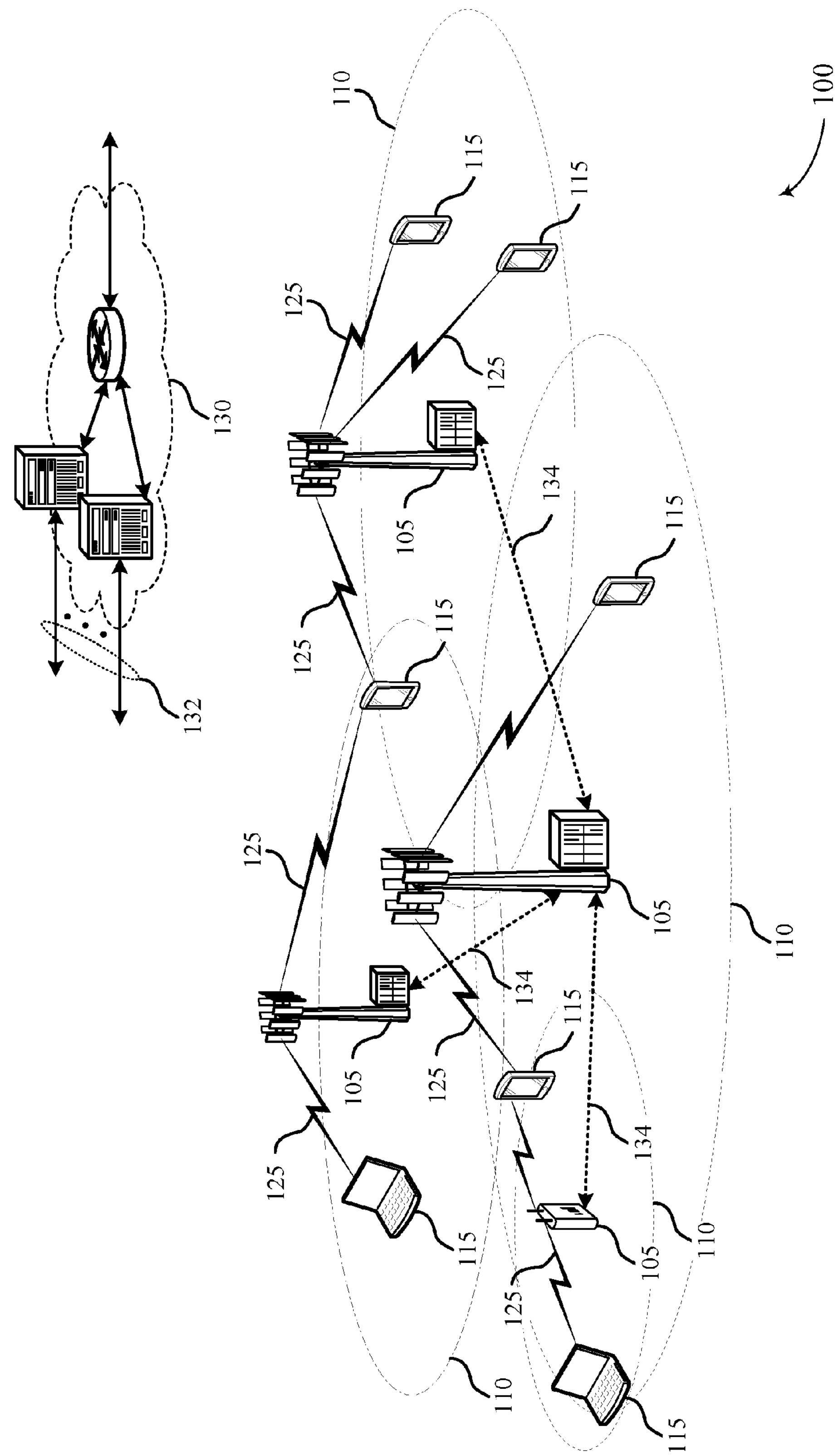
FIG. 1 illustrates an example of a wireless communications system that supports soft hybrid automatic repeat request (HARQ) in accordance with various aspects of the present disclosure.

Wireless communications systems may use error-correction techniques to improve reliability in light of packet loss or distortion that is common in these systems. The soft hybrid automatic repeat request (HARQ) techniques described herein may be employed in some systems. Soft HARQ operation may provide high levels of system reliability with smaller or more economical buffers than other techniques, including automatic repeat request (ARQ) or HARQ.

With ARQ techniques, if a receiver fails to decode a packet received from a transmitter, the transmitter may repeatedly send duplicate versions of the failed packet. Other systems may employ HARQ. HARQ may not involve retransmission of duplicate packets but may include the modification of certain physical parameters. For example, with HARQ, the bits of retransmitted packets may be encoded with an error-correction code. In some cases, the receiver may store the failed packet and soft combine it with a retransmitted packet.

In some HARQ methods, buffers that support HARQ may be sized according to peak transmission rates. For example, buffers employing double data rate (DDR) memory may have a bandwidth dictated by peak transmission rates. Log-likelihood ratio (LLR) buffer size may also be dimensioned for the lowest code rate achievable at the largest transport block size, which may be equivalent to the highest data rate. As data rates continue to increase, the modem resources (e.g., buffer size or power consumption) used for error-correction techniques, such as ARQ and HARQ, may be beyond what is desired for some mobile devices. For example, the area of the HARQ buffer or the power used to soft combine the data may become excessive. Power required for soft combining may be variable and may depend on a block error rate (BLER) of an initial transmission. In some cases, power issues associated with HARQ may be exacerbated in systems operating in unlicensed (e.g., shared) spectrum because higher transmission failure rates may be common in those scenarios. But issues associated with buffer size and power usage may be avoided or mitigated with the soft HARQ techniques described herein.

For instance, a soft HARQ technique referred to herein as incremental chase combining (ICC) HARQ may be employed to support error correction at high data rates while using smaller buffer sizes than other error correction techniques. By way of example, a fixed buffer of size B may be allocated. If a first transmission includes C0 bits, the receiver may attempt to decode C0 bits. If the receiver successfully decodes the first transmission, the receiver may send an acknowledgement message (ACK) to the transmitter. If the decoding fails, the receiver may store B bits, or fewer than B bits, in the buffer. For example, if C0 is larger than B, a portion of the original transmission of size B bits may be stored in the buffer. If C0 is smaller than B, all bits may be stored in the buffer. The bits sent to the decoder or stored in the buffer may be coded bit LLRs. If the decode fails, the receiver may send a negative ACK (NACK) to inform the transmitter that the decode failed. The transmitter may then transmit a second transmission containing C1 bits. The receiver may soft combine the stored bits in the buffer with the second transmission. This combined signal may be sent to the decoder.

If the combined signal is successfully decoded, the receiver may send an ACK. If not, the receiver may send a NACK to the transmitter, and may store some portion of the combined signal in the buffer. For example, the receiver may store parity bits that consist of a combination of the parity bits from the first transmission and the parity bits from the second transmission. A third transmission may then be received, and the receiver may combine this transmission with the stored bits. This newly combined signal may then be sent to the decoder. If decoding fails, a portion of the combined signal may be stored in the buffer. This process may be repeated until the packet is successfully decoded. But by storing a portion of the signal after a failed decode, rather than storing the entire signal, this soft HARQ operation may allow a smaller, less power-intensive buffer to be used.

In some cases, the received transmissions may contain different proportions of systematic and parity bits. This use of different proportions may be used to lower the code rate of the packet sent to the decoder. For example, the systematic bits may be stored in the buffer and combined with newly received parity bits. This combined signal, which may have a lower code rate than the first transmission, may then be sent to the decoder.

Aspects of the soft HARQ introduced above are further described below in the context of a wireless communication system. Specific examples are then described for storing a portion of a signal and decoding a retransmission based on the stored portion. These and other aspects of the disclosure are further illustrated by and described with reference to apparatus diagrams, system diagrams, and flowcharts that relate to soft HARQ.

FIG. 1 illustrates an example of a wireless communications system 100 that supports soft HARQ in accordance with various aspects of the present disclosure. The wireless communications system 100 includes base stations 105, user equipment (UEs) 115, and a core network 130. In some examples, the wireless communications system 100 may be a Long Term Evolution (LTE)/LTE-Advanced (LTE-A) network. Wireless communications system 100 may include support for a UE 115 that stores a portion of a received signal (e.g., if the buffer is not big enough to store the whole signal and the transmission is not decoded correctly). The UE 115 may then retrieve the stored portion and use it to decode a retransmission.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. UEs 115 may be dispersed throughout the wireless communications system 100, and each UE 115 may be stationary or mobile. A UE 115 may also be referred to as a mobile station, a subscriber station, a remote unit, a wireless device, an access terminal, a handset, a user agent, a client, or some other suitable terminology. A UE 115 may also be a cellular phone, a wireless modem, a handheld device, a personal computer, a tablet, a personal electronic device, a machine type communication (MTC) device or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

A communication link 125 may include one or more frequency ranges organized into carriers. A carrier may also be referred to as a CC, a layer, a channel, etc. The term "component carrier" may refer to each of the multiple carriers utilized by a UE in carrier aggregation (CA) operation, and may be distinct from other portions of system bandwidth. For instance, a component carrier may be a relatively narrow-bandwidth carrier susceptible of being utilized independently or in combination with other component carriers. Each component carrier may provide the same capabilities as an isolated carrier based on release 8 or release 9 of the Long LTE standard. Multiple component carriers may be aggregated or utilized concurrently to provide some UEs 115 with greater bandwidth and, e.g., higher data rates. Thus, individual component carriers may be backwards compatible with legacy UEs 115 (e.g., UEs 115 implementing LTE release 8 or release 9); while other UEs 115 (e.g., UEs 115 implementing post-release 8/9 LTE versions), may be configured with multiple component carriers in a multi-carrier mode. A carrier used for downlink (DL) may be referred to as a DL CC, and a carrier used for uplink (UL) may be referred to as an UL CC. A UE 115 may be configured with multiple DL component carriers (CCs) and one or more UL CCs for carrier aggregation. Each carrier may be used to transmit control information (e.g., reference signals, control channels, etc.), overhead information, data, etc. A UE 115 may communicate with a single base station 105 utilizing multiple carriers, and may also communicate with multiple base stations simultaneously on different carriers. Some wireless networks may utilize enhanced CA (eCA) operations based on a large number of carriers (e.g., between 5 and 32 carriers), operation in unlicensed spectrum, or use of enhanced CCs. CA configurations may support higher data rates than a single carrier configuration, and the data rates in an eCA configurations may be even higher. So a UE 115 operating according to a CA or eCA configuration may employ soft HARQ to increase reliability while operating with a smaller, more energy-efficient buffer than may be required for other error-correction techniques.

System 100 that may be a packet-based network that operate according to a layered protocol stack and data in the user plane may be based on Internet Protocol (IP). A radio link control (RLC) layer may perform packet segmentation and reassembly to communicate over logical channels. A medium access control (MAC) layer may perform priority handling and multiplexing of logical channels into transport channels. The MAC layer may also use HARQ to provide retransmission at the MAC layer to improve link efficiency. In the control plane, the radio resource control (RRC) protocol layer may provide establishment, configuration, and maintenance of an RRC connection between a UE 115 and the base stations 105. The RRC protocol layer may also be used for core network 130 support of radio bearers for the user plane data. At the physical (PHY) layer, the transport channels may be mapped to physical channels. As described herein, a UE 115 may determine a CE level by test decoding a broadcast signal, which may be transmitted on at the PHY layer.

Data may therefore be divided into logical channels, transport channels, and physical layer channels. DL physical channels may include physical broadcast channel (PBCH) for broadcast information (e.g., a broadcast signal test-decoded by a UE 115 to determine or verify a CE level), physical control format indicator channel (PCFICH) for control format information, physical downlink control channel (PDCCH) for control and scheduling information, physical HARQ indicator channel (PHICH) for HARQ status messages, physical downlink shared channel (PDSCH) for user data and physical multicast channel (PMCH) for multicast data. UL physical channels may include physical random access channel (PRACH) for access messages, PUCCH for control data, and physical UL shared channel (PUSCH) for user data.

PDCCH carries downlink control information (DCI) in control channel elements (CCEs), which may consist of nine logically contiguous resource element groups (REGs), where each REG contains 4 resource elements (REs). DCI includes information regarding DL scheduling assignments, UL resource grants, transmission scheme, UL power control, HARQ information, modulation and coding scheme (MCS) and other information. The size and format of the DCI messages can differ depending on the type and amount of information that is carried by the DCI.

PUCCH may be used for UL ACKs, scheduling requests (SRs) and channel quality indicators (CQI) and other UL control information. A PUCCH may be mapped to a control channel defined by a code and two consecutive resource blocks. UL control signaling may depend on the presence of timing synchronization for a cell. PUCCH resources for SR and channel quality indicator (CQI) reporting may be assigned (and revoked) RRC signaling.

As mentioned above, HARQ may be a method of ensuring that data is received correctly over a wireless communication link 125. HARQ may include a combination of error detection (e.g., using a cyclic redundancy check (CRC)), forward error correction (FEC), and retransmission (e.g., automatic repeat request (ARQ)). HARQ may improve throughput at the medium access control (MAC) layer in poor radio conditions (e.g., signal-to-noise conditions). In incremental redundancy HARQ, incorrectly received data may be stored in a buffer and combined with subsequent transmissions to improve the overall likelihood of successfully decoding the data. In some cases, the combined signal may be larger than the buffer size, and the receiver may store a portion of the combined signal. In some HARQ implementations, redundancy bits are added to each message prior to transmission. This may be useful in poor conditions. In other cases, redundancy bits are not added to each transmission but are retransmitted after the transmitter of the original message receives a NACK indicating a failed attempt to decode the information.

The chain of transmission, response, and retransmission may be referred to as a HARQ process. In some cases, a limited number of HARQ processes may be used for a given communication link 125. In general, as data transmission rates increase, the buffer power usage and its physical dimensions may increase beyond a threshold (or beyond an economically practical configuration) for some mobile devices. In some cases, the original data is encoded with an FEC code, and parity bits may be sent along with the message or may be transmitted upon request when a receiver fails to decode a packet. A parity bit may be a bit added to the end of a string of binary code that indicates whether the number of bits in the string with the value one is even or odd. Parity bits may be used as a form of error detecting code.

A UE 115 may employ soft HARQ techniques, which may be transparent to a system employing HARQ, and which may allow for smaller, more energy-efficient components at the UE 115. A UE 115 employing soft HARQ may receive a first signal and may fail to decode it. The UE 115 may store the signal in a buffer—e.g., the UE 115 may store a portion of the signal if the signal size is greater than the buffer size. The UE 115 may receive a second signal and may combine it with the stored portion of the first signal; the combined signal may be larger than the buffer size. This combined signal may also have a code rate less than the first signal. The UE 115 may perform a second decoding attempt on the combined signal. The UE 115 may determine that the second decoding attempt failed and may store a portion of the combined signal in the buffer—e.g., the portion of the combined signal may have a size less than or equal to the size of the buffer. In this way, the UE 115 may realize benefits of HARQ without storing an entire signal that failed decode and may thus operate with a smaller buffer than may be used with a common HARQ process.

Figure 2:
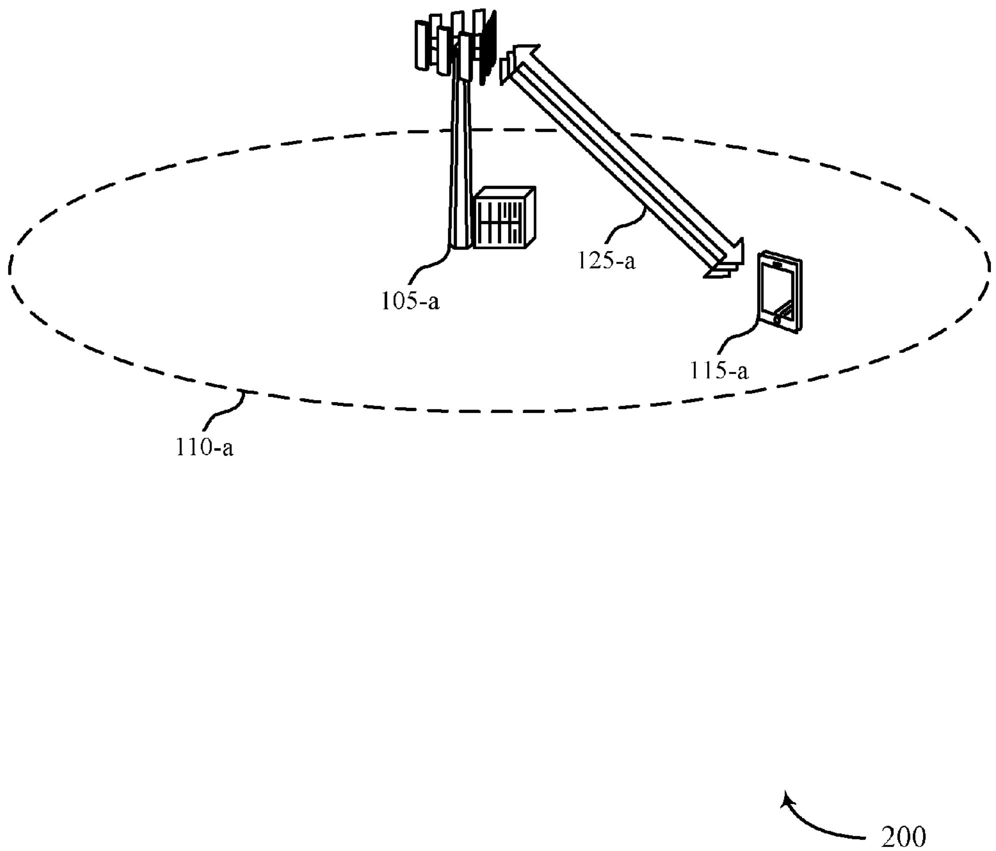
FIG. 2 illustrates an example of a wireless communications system that supports soft HARQ in accordance with various aspects of the present disclosure.

FIG. 2 illustrates an example of a wireless communications system 200 for soft HARQ in accordance with various aspects of the present disclosure. Wireless communications system 200 may include a UE 115-*a* and base station 105-*a*, which may be examples of a UE 115 an base station 105 described with reference to FIG. 1. UE 115-*a* and base station 105-*a* may communicate via communication link 125-*a*, which may include one or more CCs. In some cases, UE 115-*a* may fail to correctly decode a packet transmitted over communication link 125-*a* and may respond with a NACK to base station 105-*a*. UE 115-*a* may then store failed packets in a buffer and base station 105-*a* may retransmit additional redundancy versions. UE 115-*a* may combine newly received transmissions with the bits stored in the buffer and then attempt to decode the combined signal.

Failure to decode transmitted packets may result from path loss, noise, or other conditions associated with communication link 125-*a* so that communications may be subject to loss or distortion during transmission. Wireless communications system 200 may use error-correction techniques to improve reliability. For example, if UE 115-*a* fails to decode a packet received from base station 105-*a*, base station 105-*a* may repeatedly send the failed packet using a technique mentioned above and known as ARQ. ARQ is a technique that retransmits packets with no constraint on systematic bits. For example, retransmitted packets may include no new systematic bits. ARQ attempts to decode each received packet, e.g., it may not soft combine coded bit LLRs with previous transmissions.

Another error-correction technique also mentioned above is HARQ. HARQ benefits may be realized in low signal to noise ratio (SNR) environments with varying channel or interference statistics and imperfect rate control. Base station 105-*a* may use HARQ and may not retransmit duplicate packets, but may instead modify certain physical parameters before retransmission. For example, bits may be encoded with an error-correction code. In some cases, the receiver (e.g., UE 115) may store the failed packet and soft combine it with a re-transmitted packet. These re-transmitted packets may be known as redundancy versions (RVs). HARQ may send unmodified systematic bits and new or previously coded bits, which are retransmitted with a new or previous modulation order. This may allow for soft combining of coded bit LLRs. In some cases, the instantaneous code rate per RV may be non-uniform. In one method of HARQ, identical coded bits may be transmitted across RVs and is known as chase combining. In another method, IR, different coded bits can be transmitted across RVs as mentioned above.

As mentioned above, in some HARQ methods (e.g., IR-HARQ) peak transmission rates may dictate a buffer bandwidth. An LLR buffer size may be dimensioned for the lowest code rate achievable at the largest transport block size, which may be equivalent to the highest data rate. For example, if the maximum transport block size is K systematic bits large, the LLR buffer size is $B=\beta\cdot K$ where $\beta$ may be a range of values, for example, $1\leq\beta\leq 3$ in case of LTE. As data rates continue to increase, the modem resources used by UE 115-*a* for error-correction techniques, such as HARQ, may be beyond what is desired for some mobile devices. For example, the area of the HARQ buffer or the power used to soft combine the data may become excessive.

In some examples, including those employing incremental chase combining (ICC) HARQ described herein, a fixed buffer of size B may be allocated for UE 115-*a*, where $B=\lambda\cdot K$ and K is the number of systematic bits and $1\leq\lambda<\beta$. If, for example, a first transmission from base station 105-*a* contains C0 bits, UE 115-*a* may attempt to decode C0 bits. If UE 115-*a* successfully decodes the packet, UE 115-*a* may send an ACK to base station 105-*a*. If the decoding fails, UE 115-*a* may store at most B bits into the buffer. For example, if C0 is larger than B, a portion of the original packet of size B bits may be stored in the buffer. If C0 is smaller than B, all bits may be stored in the buffer, where the number of stored bits may be denoted as $L0=\min\{C0, B\}$. The bits sent to the decoder or stored in the buffer may be coded bit LLRs. If the decode fails, UE 115-*a* may send a NACK to inform base station 105-*a* that the packet failed to decode. Base station 105-*a* may then transmit a second transmission that may contain C1 bits. UE 115-*a* may soft combine the stored bits in the buffer (L0 bits) with the second transmission (C1 bits). This combined signal may be sent to the decoder. If the combined packet is successfully decoded, UE 115-*a* may send an ACK. If not, UE 115-*a* may send a NACK to the transmitter, and may store some combination of the combined signal in the buffer. The combined signal may have C1+L0 bits. If C1+L0 is larger than B, a portion of it of size B bits may be stored in the buffer. If C1+L0 is smaller than B, all C1+L0 bits may be stored in the buffer, where the number of stored bits may be denoted as $L1=\min\{C1+L0, B\}$. A third transmission having C2 coded bits may then be received by UE 115-*a*, and UE 115-*a* may combine this transmission (C2 bits) with the stored bits (L1 bits). This newly combined signal of C2+L1 bits may then be sent to the decoder. If decoding fails, a portion of the combined signal of $L2=\min\{C2+L1, B\}$ bits may be stored in the buffer. This process may be repeated until the packet is successfully decoded.

In general, the number of LLRs retrieved from the buffer for soft combining may be $\lambda\cdot K$, where K is the number of systematic bits in a transmission, $1\leq\lambda<\beta$, and $\beta$ is a predetermined number, typically $1\leq\beta\leq 3$. But the instantaneous code rate of the input to the decoder may be lower than $$\frac{1}{\lambda}.$$

To illustrate this, two examples are discussed below, although additional examples and implementations will be apparent to those skilled in the art.

By way of example, K=1 million (M) bits are transmitted by base station 105-*a* at 1 Gbps using a CA configuration that includes 5 CCs. The ICC LLR buffer size of UE 115-*a* may be B=1.2 M bits in size. Base station 105-*a* may send a first packet containing mostly systematic bits and a few parity bits, for example K=1 M systematic bits and P0=0.2 M parity bits, a total of C0=K+P0=1.2 M coded bits. A decoder of UE 115-*a* may fail to decode the packet of 1 M systematic bits and 0.2 M parity bits. In this case, the code rate seen by the decoder may be $$\text{code rate} = \frac{1\text{ M}}{1\text{ M} + 0.2\text{ M}} = 0.83.$$

The decoder may then place the C0=1.2 M bit packet into the LLR buffer of size B=1.2 M bits. Base station 105-*a* may then send a second packet of mostly systematic bits and new parity bits, for example K=1 M systematic bits and P1=0.2 M new parity bits, a total of C1=1.2 M bits. UE 115-*a* may soft combine the systematic bits. The decoder input may then be coded LLR bits consisting of K+P0+P1=1 M Systematic+0.2 M Parity0+0.2 M Parity1. In this case, the code rate seen by the decoder may be $$\text{code rate} = \frac{1\text{ M}}{1\text{ M} + 0.2\text{ M} + 0.2\text{ M}} = 0.71.$$

If the decoder fails, UE 115-*a* may store K=1 M soft combined systematic bits as well as 0.2 M parity bits in the buffer, a total of B=1.2 M bits. The parity bits may be a combination of the P0 and P1 parity bits from the first and second transmission. In some cases, the parity bit storage may be based on relative SNR of the transmissions. That is, a decision of whether to store parity bits from the first (P0) or second (P1) transmission may be based on an SNR of each transmission. If the first transmission has an SNR of 20 dB and the second transmission has an SNR of 15 dB, parity bits from the first transmission may be stored in the buffer even after failed decodes of the first transmission and the subsequent second transmission, because the first transmission had a higher SNR.

Contrast the above with the IR-HARQ, where the entire systematic and parity bits K+P0+P1=1.4 M bits are stored in the buffer, thus requiring a larger buffer size.

In another example, K=1 M bits may be transmitted by base station 105-*a* at 1 Gbps using 5 times CA. The ICC LLR buffer size of UE 115-*a* may be B=1.2 M bits in size. Base station 105-*a* may send a first packet containing mostly systematic bits and a few parity bits, for example K=1 M systematic bits and P0=0.2 M parity bits, a total of C0=K+P0=1.2 M coded bits. The decoder of UE 115-*a* may fail to correctly decode the packet of 1 M systematic bits and 0.2 M parity bits, where the $$\text{code rate} = \frac{1\text{ M}}{1\text{ M} + 0.2\text{ M}} = 0.83.$$

UE 115-*a* may then store the 1.2 M bit packet into the buffer. Base station 105-*a* may then send a second packet containing only new parity bits, for example, P1=1.2 M Parity bits. In this case, C2=P1. UE 115-*a* may then decode a combined signal consisting of the K=1 M systematic bits and P0=0.2

M parity bits from the buffer along with the newly received P1=1.2 M parity bits. In this case, the $$\text{code rate} = \frac{1\text{ M}}{1\text{ M} + 0.2\text{ M} + 1.2\text{ M}} = 0.42.$$

If the decoder fails, the K=1 M systematic bits may be stored in the buffer with 0.2 M parity bits. The stored parity bits may consist of some combination of the 0.2 M parity bits from the first transmission and the 1.2 M parity bits from the second transmission.

Contrast the above with the IR-HARQ, where the entire systematic and parity bits K+P0+P1=2.4 M bits are stored in the buffer, thus requiring a larger buffer size.

Figure 3:
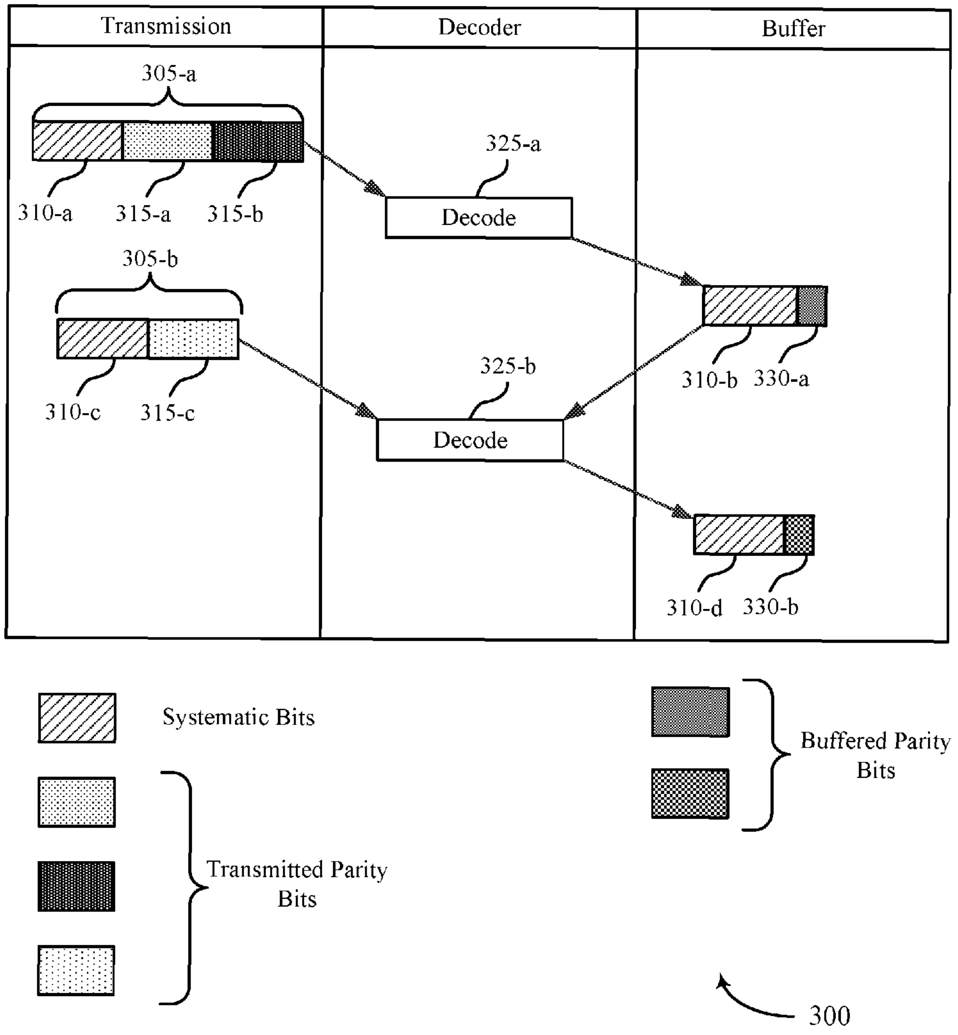
FIG. 3 illustrates an example of a signal decoding process that supports soft HARQ in accordance with various aspects of the present disclosure.

FIG. 3 illustrates an example of a signal decoding process 300 for soft HARQ in accordance with various aspects of the present disclosure. Signal decoding process 300 may involve a UE 115 and a base station 105 as described with reference to FIGS. 1-2. Packets received by the UE 115 and combined with bits stored in a buffer. The combined packet may be sent to a decoder. If the decode fails, a portion of the combined signal may be stored in the buffer. Although the example of FIG. 3 is described in the context of a base station 105 acting as a transmitter and a UE 115 as a receiver, the technique may also apply to a situation where the transmitter is a UE 115 and the receiver is a base station 105. That is, in some cases, a base station 105 may receive an UL message and store a portion of the bits in a buffer.

Transmission 305-*a* may be sent from a base station 105 to a UE 115, which may be examples of a UE 115 and base station 105 described with reference to FIGS. 1-2. Transmission 305-*a* may contain multiple packets, including, for example, systematic bits 310-*a*, a first set of parity bits 315-*a*, or a second set of parity bits 315-*b*. Systematic bits 310-*a* may be data or information bits. The first set of parity bits 315-*a* may be used for error correction and may help a UE 115 successfully decode the packet. The second set of parity bits 315-*b* may include a second set of bits used for error correction and may help a UE 115 successfully decode the packet.

In a first decoding process 325-*a*, a decode (e.g., a decoder of a UE 115) may try to decode transmission 305-*a* so that the receiver or receiving device (e.g. example a UE 115) may correctly interpret systematic bits 310-*a*. If the first decoding process 325-*a* fails, some portion of bits from transmission 305-*a* are stored in a buffer. The portion of bits stored in the buffer may include buffered systematic bits 310-*b* and buffered parity bits 330-*a*. Systematic bits 310-*b* may be based on the same information as systematic bits 310-*a*. Buffered parity bits 330-*a* may be based on some combination of the first set of parity bits 315-*a* and second set of parity bits 315-*b*.

A second transmission 305-*b* may be transmitted if the transmitter receives a NACK from the receiver. Second transmission 305-*b* may contain information based on systematic bits 310-*a*. Systematic bits 310-*c* may be included in the second transmission 305-*b*. Systematic bits 310-*c* may be based on the same information as systematic bits 310-*a*. If the transmitter retransmits the previous packet, it may retransmit the previous systematic bits (systematic bits 310-*a*). A third set of parity bits 315-*c* may also be included in second transmission 305-*b*. The third set of parity bits 315-*c* may be different from the first set of parity bits 315-*a* or the second set of parity bits 315-*b* bits included in transmission 305-*a*. The third set of parity bits 315-*c* may be used for error correction. In some cases (not shown), Second transmission 305-*b* may include more than one set of parity bits, and may not include systematic bits.

A second decoding process 325-*b* may include soft combining systematic bits 310-*b* stored in the buffer with systematic bits 310-*c* from second transmission 305-*b*. Decoding process 325-*b* may also use the second transmission parity bits 315-*c* and buffered parity bits 330-*a* to decode the soft combined systematic bits. If the second decoding process 325*b* fails, the receiver may store a portion of bits from the buffer and second transmission 305-*b* in the buffer. The combination of bits stored in the buffer may be systematic bits 310-*d* and buffered parity bits 330-*b*. Systematic bits 310-*d* may be based on the soft combined systematic bits. Parity bits 330-*b* may be based on some combination of buffered parity bits 315-*b* and the third set of parity bits 330-*a*.

Figure 4:
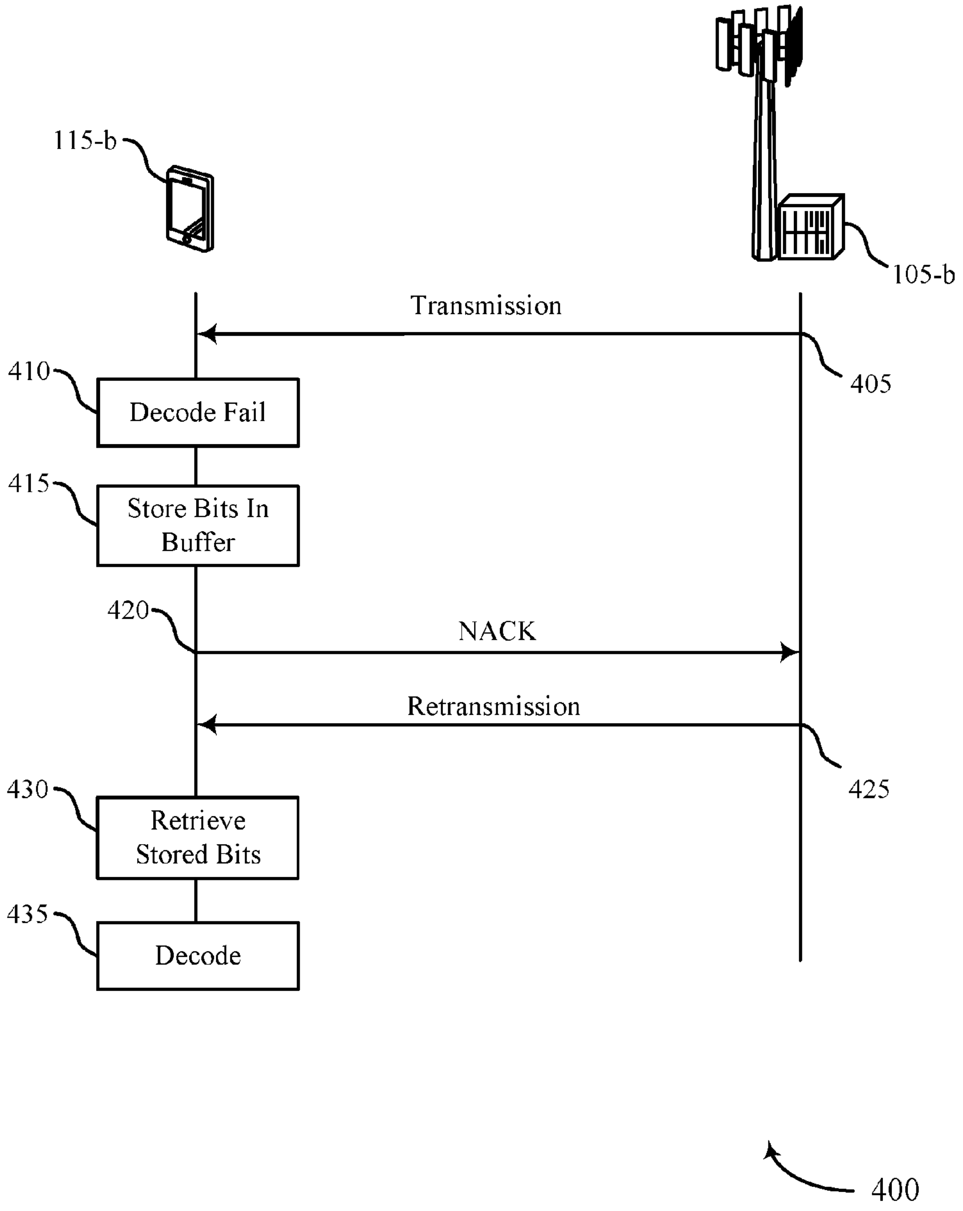
FIG. 4 illustrates an example of a process flow in a system that supports soft HARQ in accordance with various aspects of the present disclosure.

FIG. 4 illustrates an example of a process flow 400 in a system that supports soft HARQ in accordance with various aspects of the present disclosure. Process flow 400 may include a UE 115-*b* and base station 105-*b*, which may be examples of a UE 115 and base station 105 described with reference to FIGS. 1-3. That is, UE 115-*b* may fail to decode a received transmission from base station 105-*b* and may store a portion of the packet in a buffer. UE 115-*a* may combine future received transmissions with the stored bits and attempt to decode the combined signal.

At step 405, UE 115-*b* may receive a first transmission. This may include receiving a downlink data channel of multiple CCs. In some examples, the first signal includes a coded information portion and parity portion and the code rate of the first signal may be less than one. At step 410, UE 115-*b* may send the received bits to a decoder and may determine that the packet was not decoded successfully.

At step 415, UE 115-*b* may store a portion of the first transmission in the buffer. UE 115-*b* may identify the size of the buffer, which may be less than the size of a system transport block at the lowest code rate. That is, the buffer may not be sufficiently large to store the whole transmission. In some examples, the buffer includes an LLR buffer. UE 115-*b* may store a portion of the first transmission having a size less than or equal to the size of the buffer and may store the bits based on the failed decoding attempt of the first transmission. The stored portion may include systematic and parity bits.

At step 420, UE 115-*b* may send a NACK signal to base station 105-*a* indicating that the decoding attempt of the first transmission failed (e.g., as part of a HARQ process). At step 425, UE 115-*b* may receive a second transmission (i.e., a retransmission of the first transmission). The second transmission may include systematic bits, parity bits, or a combination of systematic and parity bits. UE 115-*b* may receive signaling indicative of whether the second signal includes a systematic information portion or a parity portion, or both.

At step 430, UE 115-*b* may soft combine the second transmission and the stored portion of the first signal to form a combined signal having a combined signal size that is greater than the size of the buffer. Thus, in some examples combining the second signal and the stored portion of the first signal includes soft-combining systematic information portions of the first and second signals. The combined signal may include a systematic information portion, a first parity portion based on the first signal, and a second parity portion based on the second signal. In some examples, the second signal may be combined with the stored portion of the first signal without storing the second signal prior to combining.

At step 435, UE 115-*b* may perform a decoding attempt on the combined signal. In some cases, the combined signal may have a code rate that is less than a code rate of the first signal. UE 115-*b* may determine that the second decoding attempt of the combined signal failed. UE 115-*b* may store a portion of the combined signal in the buffer based on determining that the second decoding attempt failed, the portion of the combined signal having a combined signal size that is less than or equal to the size of the buffer. In some examples, the stored portion of the combined signal includes a systematic information portion and a first parity portion of the first signal or a second parity portion of the second signal, or both. In some cases, UE 115-*b* may select a first portion of the first and second signals for storing based on a SNR. Selecting the portion of the first and second signals for storing may include identifying a systematic information or parity portion, or both, for storing based on a relative SNR of the first and second signal.

Figure 5:
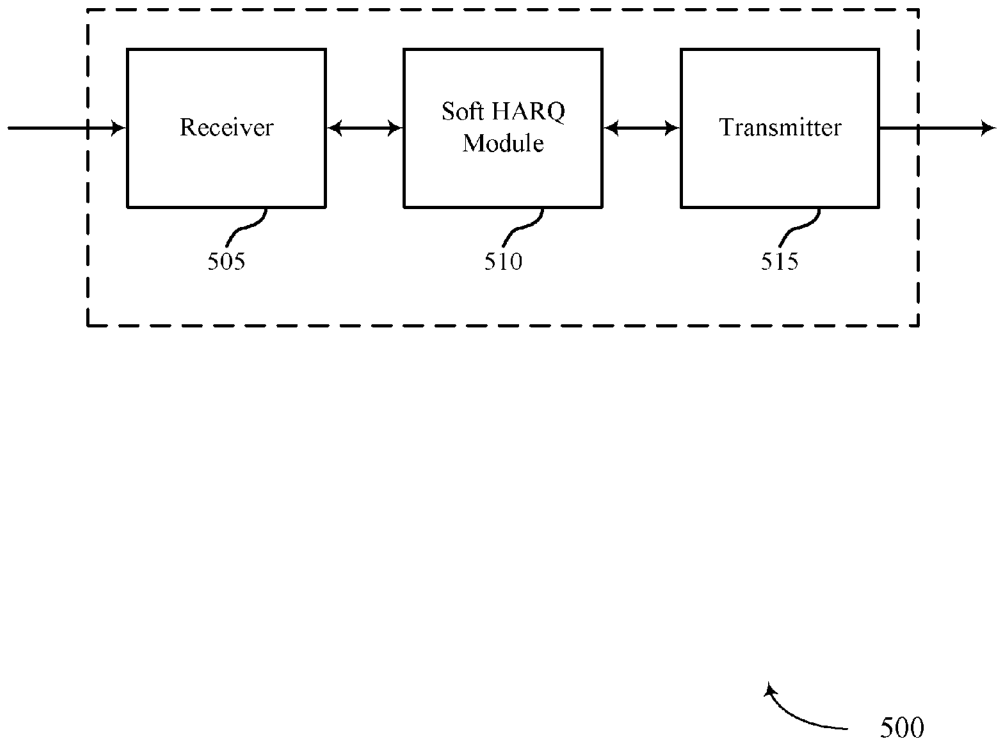
FIGS. 5-7 show block diagrams of a wireless device or devices that support soft HARQ in accordance with various aspects of the present disclosure.

FIG. 5 shows a block diagram of a wireless device 500 that supports soft HARQ in accordance with various aspects of the present disclosure. Wireless device 500 may be an example of aspects of a UE 115 described with reference to FIGS. 1-4. Wireless device 500 may include a receiver 505, a soft HARQ module 510, or a transmitter 515. Wireless device 500 may also include a processor. Each of these components may be in communication with one another.

The receiver 505 may receive information such as packets, user data, or control information associated with various information channels (e.g., control channels, data channels, and information related to soft HARQ, etc.). Information may be passed on to the soft HARQ module 510, and to other components of wireless device 500.

The soft HARQ module 510 may identify a size of a buffer, receive a first signal having a size that is greater than the size of the buffer, determine that a decoding attempt of the first signal failed, and store a portion of the first signal in the buffer, a size of the portion being less than or equal to the size of the buffer and stored based on the determination that the decoding attempt of the first signal failed.

The transmitter 515 may transmit signals received from other components of wireless device 500. In some examples, the transmitter 515 may be collocated with the receiver 505 in a transceiver module. The transmitter 515 may include a single antenna, or it may include multiple antennas.

Figure 6:
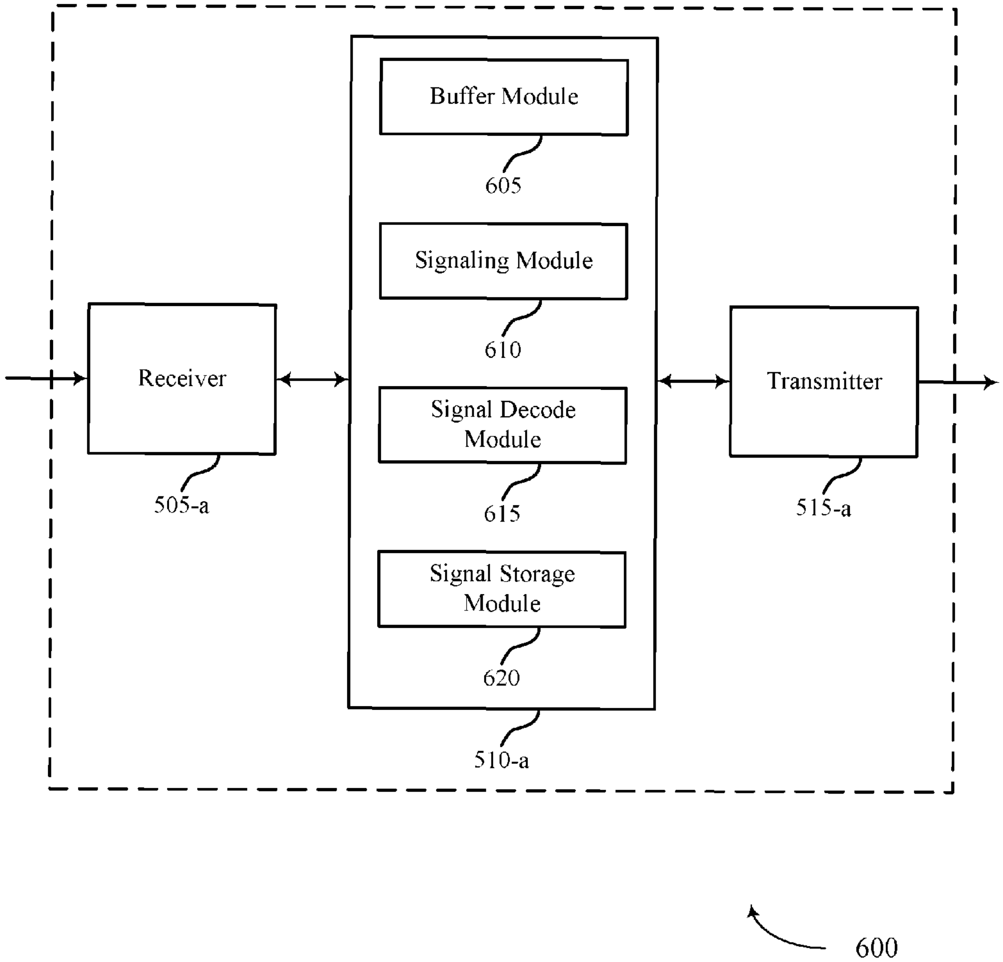

FIG. 6 shows a block diagram of a wireless device 600 that supports soft HARQ in accordance with various aspects of the present disclosure. Wireless device 600 may be an example of aspects of a wireless device 500 or a UE 115 described with reference to FIGS. 1-5. Wireless device 600 may include a receiver 505-*a*, a soft HARQ module 510-*a*, or a transmitter 515-*a*. Wireless device 600 may also include a processor. Each of these components may be in communication with each other. The soft HARQ module 510-*a* may also include a buffer module 605, a signaling module 610, a signal decode module 615, and a signal storage module 620.

The receiver 505-*a* may receive information which may be passed on to soft HARQ module 510-*a*, and to other components of wireless device 600. The soft HARQ module 510-*a* may perform the operations described with reference to FIG. 5. The transmitter 515-*a* may transmit signals received from other components of wireless device 600.

The buffer module 605 may identify a size of a buffer as described with reference to FIGS. 2-4. In some examples, the buffer includes an LLR buffer. In some examples, the size of the buffer may be less than a size of a system transport block size at a lowest code rate.

The signaling module 610 may receive a first signal having a size that is greater than the size of the buffer as described with reference to FIGS. 2-4. For instance, the first signal may be a downlink data channel of multiple of CCs. The signaling module 610 may also receive a second signal. In some examples, the code rate of the first signal may be less than one. The signaling module 610 may, in some cases, receive signaling indicative of whether the second signal includes a systematic information portion or a parity portion, or both. In some examples, the first signal includes a coded information portion and parity portion.

The signal decode module 615 may determine that a decoding attempt of the first signal failed as described with reference to FIGS. 2-4. The signal decode module 615 may also perform a second decoding attempt on the combined signal. The signal decode module 615 may also determine that the second decoding attempt of the combined signal failed.

The signal storage module 620 may store a portion of the first signal in the buffer based on, for instance, the determination that the decoding attempt of the first signal failed as described with reference to FIGS. 2-4. A size of the portion of the first signal stored may be less than or equal to the size of the buffer. The signal storage module 620 may also store a portion of the combined signal in the buffer based on the determination that the second decoding attempt failed; the portion of the combined signal may have a size that is less than or equal to the size of the buffer. In some examples, the stored portion of the combined signal includes a systematic information portion and either a first parity portion of the first signal or a second parity portion of the second signal, or both. The signal storage module 620 may also select the portion of the first and second signals for storing based on an SNR. In some examples, selecting the portion of the first and second signals for storing includes identifying one or both of a systematic information or parity portion for storing based on a relative SNR of the second signal and the first signal.

Figure 7:
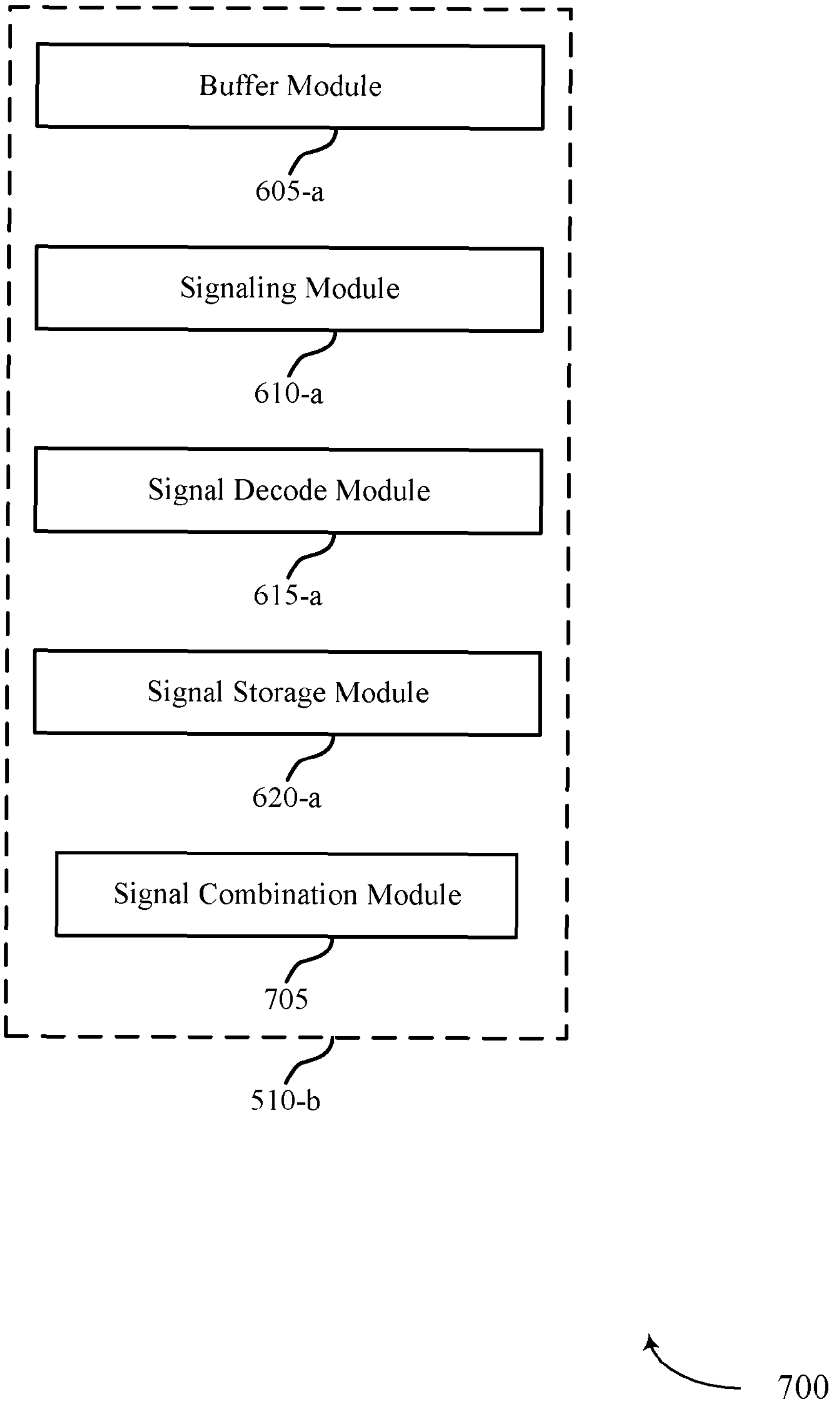

FIG. 7 shows a block diagram 700 of a soft HARQ module 510-*b* which may be a component of a wireless device 500 or a wireless device 600 that supports soft HARQ in accordance with various aspects of the present disclosure. The soft HARQ module 510-*b* may be an example of aspects of a soft HARQ module 510 described with reference to FIGS. 5-6. The soft HARQ module 510-*b* may include a buffer module 605-*a*, a signaling module 610-*a*, a signal decode module 615-*a*, and a signal storage module 620-*a*. Each of these modules may perform the functions described with reference to FIG. 6. The soft HARQ module 510-*b* may also include and a signal combination module 705.

The signal combination module 705 may combine the second signal and the buffered portion of the first signal to form a combined signal having a size that is greater than the size of the buffer as described with reference to FIGS. 2-4. In some examples, the combined signal has a code rate that may be less than a code rate of the first signal. In some cases, combining the second signal and the stored portion of the first signal includes soft-combining systematic information portions of the first and second signal. Additionally or alternatively, the combined signal includes a systematic information portion, a first parity portion based on the first signal, and a second parity portion based on the second signal. In some examples, the second signal may be combined with the stored portion of the first signal without storing the second signal prior to the combining.

Figure 8:
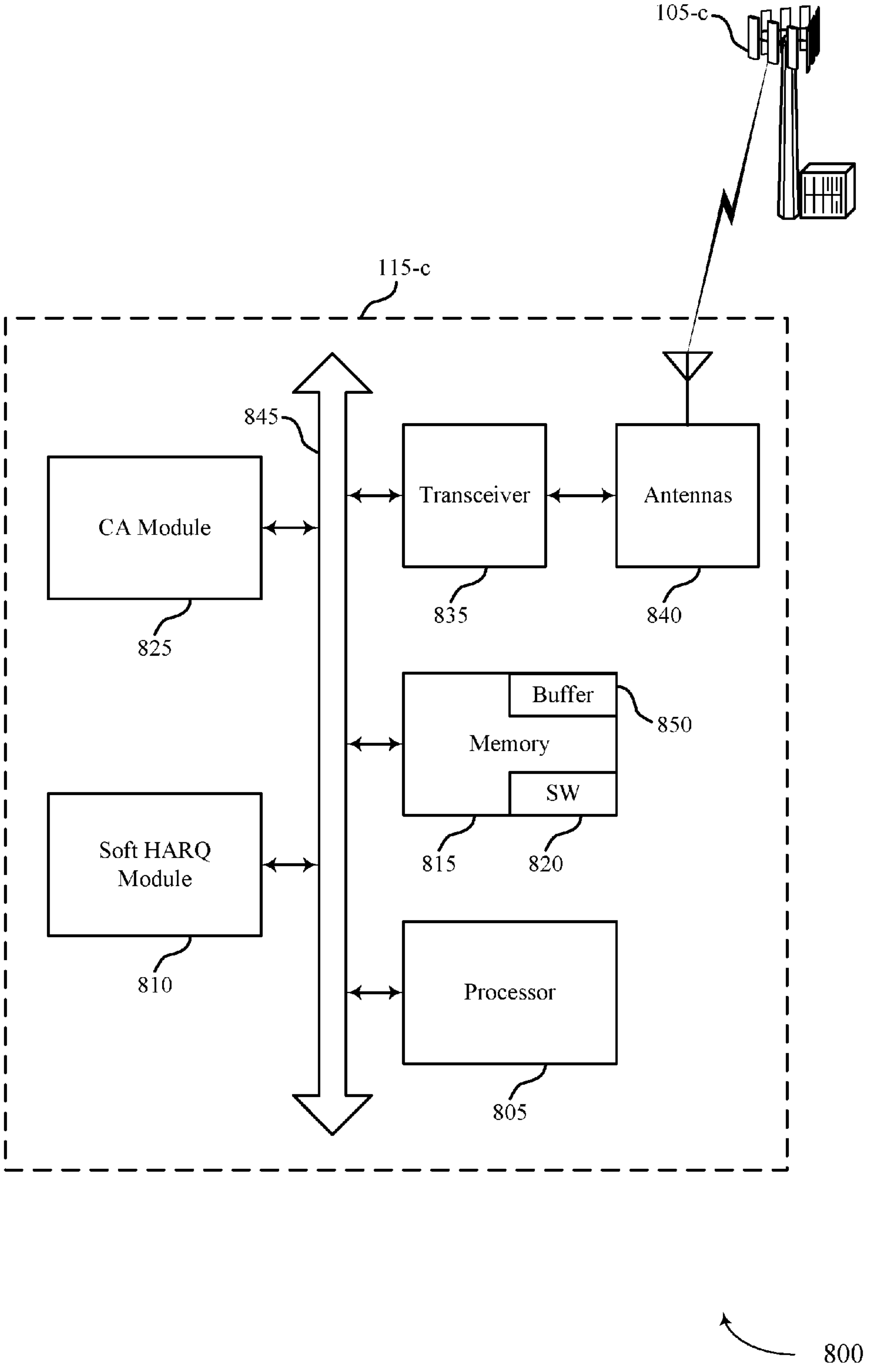
FIG. 8 illustrates a block diagram of a system, including a user equipment (UE), that supports soft HARQ in accordance with various aspects of the present disclosure.

FIG. 8 shows a diagram of a system 800 including a UE 115 configured for soft HARQ in accordance with various aspects of the present disclosure. System 800 may include UE 115-*c*, which may be an example of a wireless device 500, a wireless device 600, or a UE 115 described with reference to FIGS. 1, 2 and 5-7. UE 115-*c* may include a soft HARQ module 810, which may be an example of a soft HARQ module 510 described with reference to FIGS. 5-7. UE 115-*c* may also include a CA module. CA module 825 may be capable of supporting CA operations as described with reference to FIG. 1, including, for instance, an eCA configuration of 5 or more CCs. UE 115-*c* may also include components for bi-directional voice and data communications including components for transmitting communications and components for receiving communications. For example, UE 115-*c* may communicate bi-directionally with base station 105-*c*.

UE 115-*c* may also include a processor 805, and memory 815 (including software (SW) 820), a transceiver 835, one or more antenna(s) 840, and a buffer 850, each of which may communicate, directly or indirectly, with one another (e.g., via buses 845). The transceiver 835 may communicate bi-directionally, via the antenna(s) 840 or wired or wireless links, with one or more networks, as described above. For example, the transceiver 835 may communicate bi-directionally with a base station 105 or another UE 115. The transceiver 835 may include a modem to modulate the packets and provide the modulated packets to the antenna(s) 840 for transmission, and to demodulate packets received from the antenna(s) 840. While UE 115-*c* may include a single antenna 840, UE 115-*c* may also have multiple antennas 840 capable of concurrently transmitting or receiving multiple wireless transmissions.

The memory 815 may include random access memory (RAM) and read only memory (ROM). In some cases, memory 815 may include a buffer 850 for storing HARQ related information such as bits from a failed transmission, as described above with respect to FIGS. 1-3. The memory 815 may store computer-readable, computer-executable software/firmware code 820 including instructions that, when executed, cause the processor 805 to perform various functions described herein (e.g., soft HARQ, etc.). Or the software/firmware code 820 may not be directly executable by the processor 805 but cause a computer (e.g., when compiled and executed) to perform functions described herein. The processor 805 may include an intelligent hardware device, (e.g., a central processing unit (CPU), a microcontroller, an application specific integrated circuit (ASIC), etc.)

The components of wireless device 500, wireless device 600, soft HARQ modules 510, and system 800 may, individually or collectively, be implemented with at least one ASIC adapted to perform some or all of the applicable functions in hardware. Alternatively, the functions may be performed by one or more other processing units (or cores), on at least one IC. In other examples, other types of integrated circuits may be used (e.g., Structured/Platform ASICs, a field programmable gate array (FPGA), or another semi-custom IC), which may be programmed in any manner known in the art. The functions of each unit may also be implemented, in whole or in part, with instructions embodied in a memory, formatted to be executed by one or more general or application-specific processors.

Figure 9:
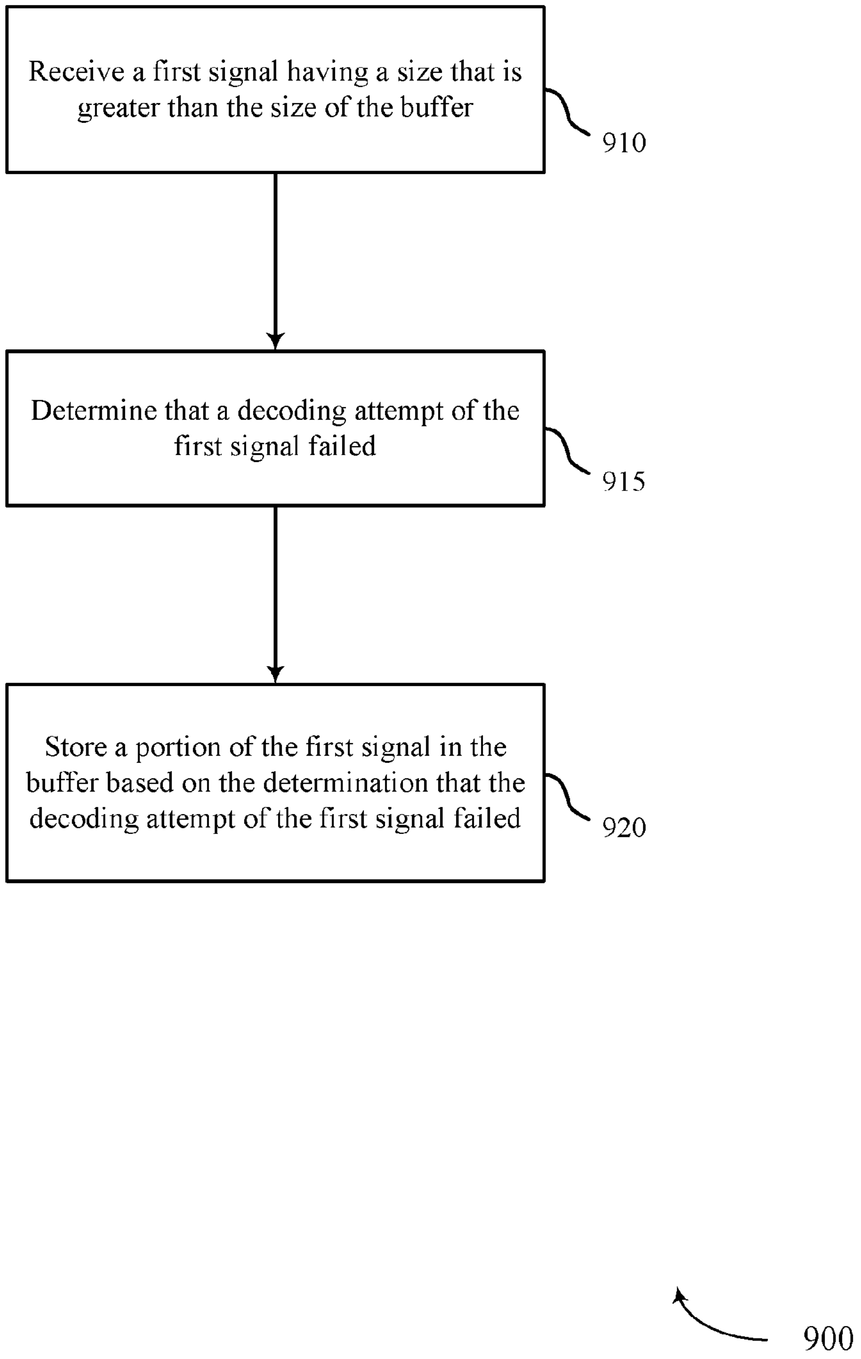
FIGS. 9-12 illustrate methods for soft HARQ in accordance with various aspects of the present disclosure.

FIG. 9 shows a flowchart illustrating a method 900 for soft HARQ in accordance with various aspects of the present disclosure. The operations of method 900 may be implemented by a UE 115 or its components as described with reference to FIGS. 1-8. For example, the operations of method 900 may be performed by the soft HARQ module 510 as described with reference to FIGS. 5-8. In some examples, a UE 115 may execute a set of codes to control the functional elements of the UE 115 to perform the functions described below. Additionally or alternatively, the UE 115 may perform aspects the functions described below using special-purpose hardware.

At block 910, the UE 115 may receive a first signal having a size that is greater than the size of the buffer as described with reference to FIGS. 2-4. In certain examples, the operations of block 910 may be performed by the signaling module 610 as described with reference to FIG. 6.

At block 915, the UE 115 may determine that a decoding attempt of the first signal failed as described with reference to FIGS. 2-4. In certain examples, the operations of block 915 may be performed by the signal decode module 615 as described with reference to FIG. 6.

At block 920, the UE 115 may store a portion of the first signal in the buffer, a size of the portion being less than or equal to the size of the buffer and stored based on the determination that the decoding attempt of the first signal failed as described with reference to FIGS. 2-4. In certain examples, the operations of block 920 may be performed by the signal storage module 620 as described with reference to FIG. 6.

Figure 10:
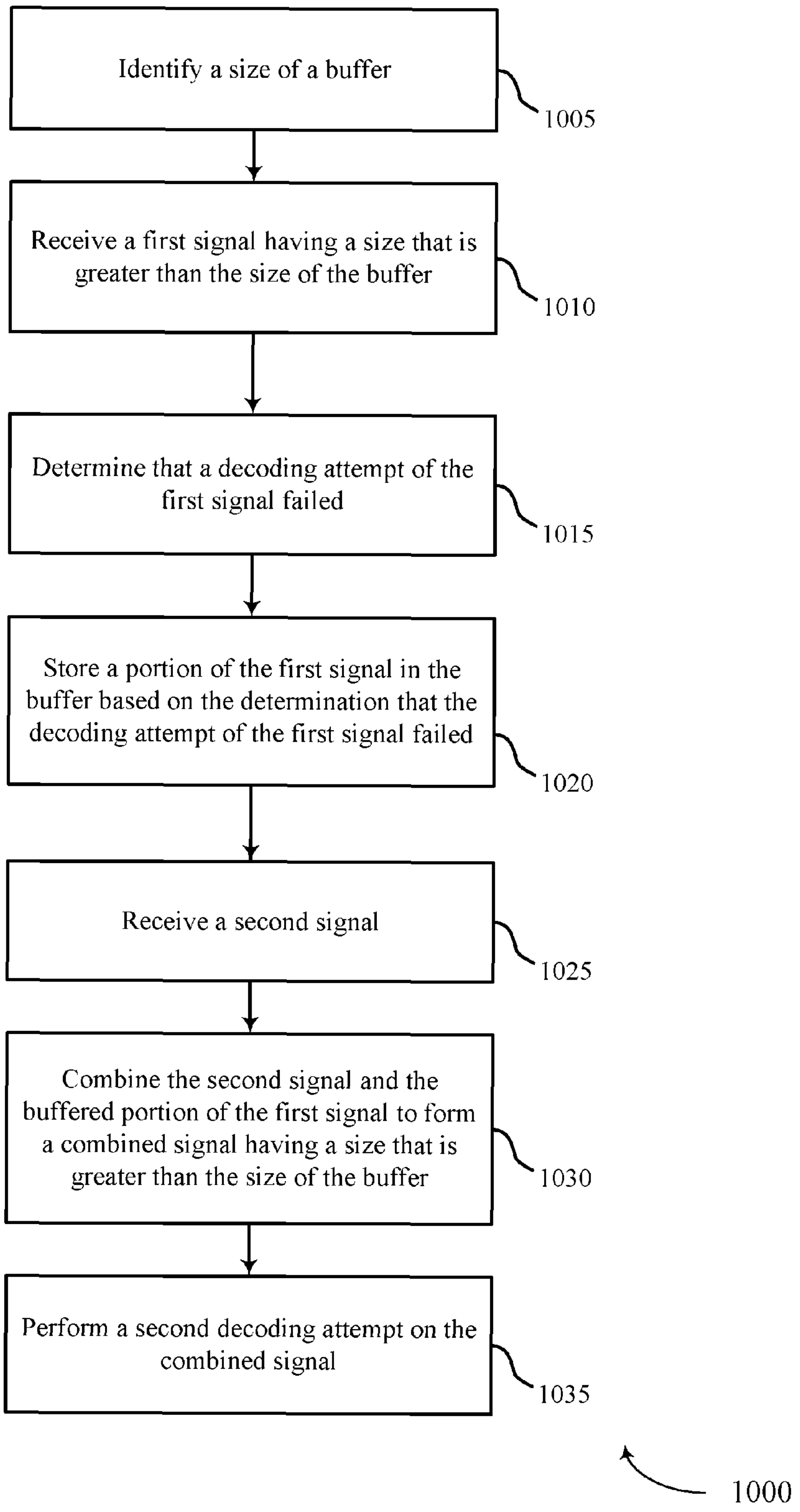

FIG. 10 shows a flowchart illustrating a method 1000 for soft HARQ in accordance with various aspects of the present disclosure. The operations of method 1000 may be implemented by a UE 115 or its components as described with reference to FIGS. 1-8. For example, the operations of method 1000 may be performed by the soft HARQ module 510 as described with reference to FIGS. 5-8. In some examples, a UE 115 may execute a set of codes to control the functional elements of the UE 115 to perform the functions described below. Additionally or alternatively, the UE 115 may perform aspects the functions described below using special-purpose hardware. The method 1000 may also incorporate aspects of method 900 of FIG. 9.

At block 1005, the UE 115 may identify a size of a buffer as described with reference to FIGS. 2-4. In certain examples, the operations of block 1005 may be performed by the buffer module 605 as described with reference to FIG. 6.

At block 1010, the UE 115 may receive a first signal having a size that is greater than the size of the buffer as described with reference to FIGS. 2-4. In certain examples, the operations of block 1010 may be performed by the signaling module 610 as described with reference to FIG. 6.

At block 1015, the UE 115 may determine that a decoding attempt of the first signal failed as described with reference to FIGS. 2-4. In certain examples, the operations of block 1015 may be performed by the signal decode module 615 as described with reference to FIG. 6.

At block 1020, the UE 115 may store a portion of the first signal in the buffer, a size of the portion being less than or equal to the size of the buffer and stored based on the determination that the decoding attempt of the first signal failed as described with reference to FIGS. 2-4. In certain examples, the operations of block 1020 may be performed by the signal storage module 620 as described with reference to FIG. 6.

At block 1025, the UE 115 may receive a second signal as described with reference to FIGS. 2-4. In certain examples, the operations of block 1025 may be performed by the signaling module 610 as described with reference to FIG. 6.

At block 1030, the UE 115 may combine the second signal and the buffered portion of the first signal to form a combined signal having a combined signal size that is greater than the size of the buffer as described with reference to FIGS. 2-4. In certain examples, the operations of block 1030 may be performed by the signal combination module 705 as described with reference to FIG. 7.

At block 1035, the UE 115 may perform a second decoding attempt on the combined signal as described with reference to FIGS. 2-4. In certain examples, the operations of block 1035 may be performed by the signal decode module 615 as described with reference to FIG. 6.

Figure 11:
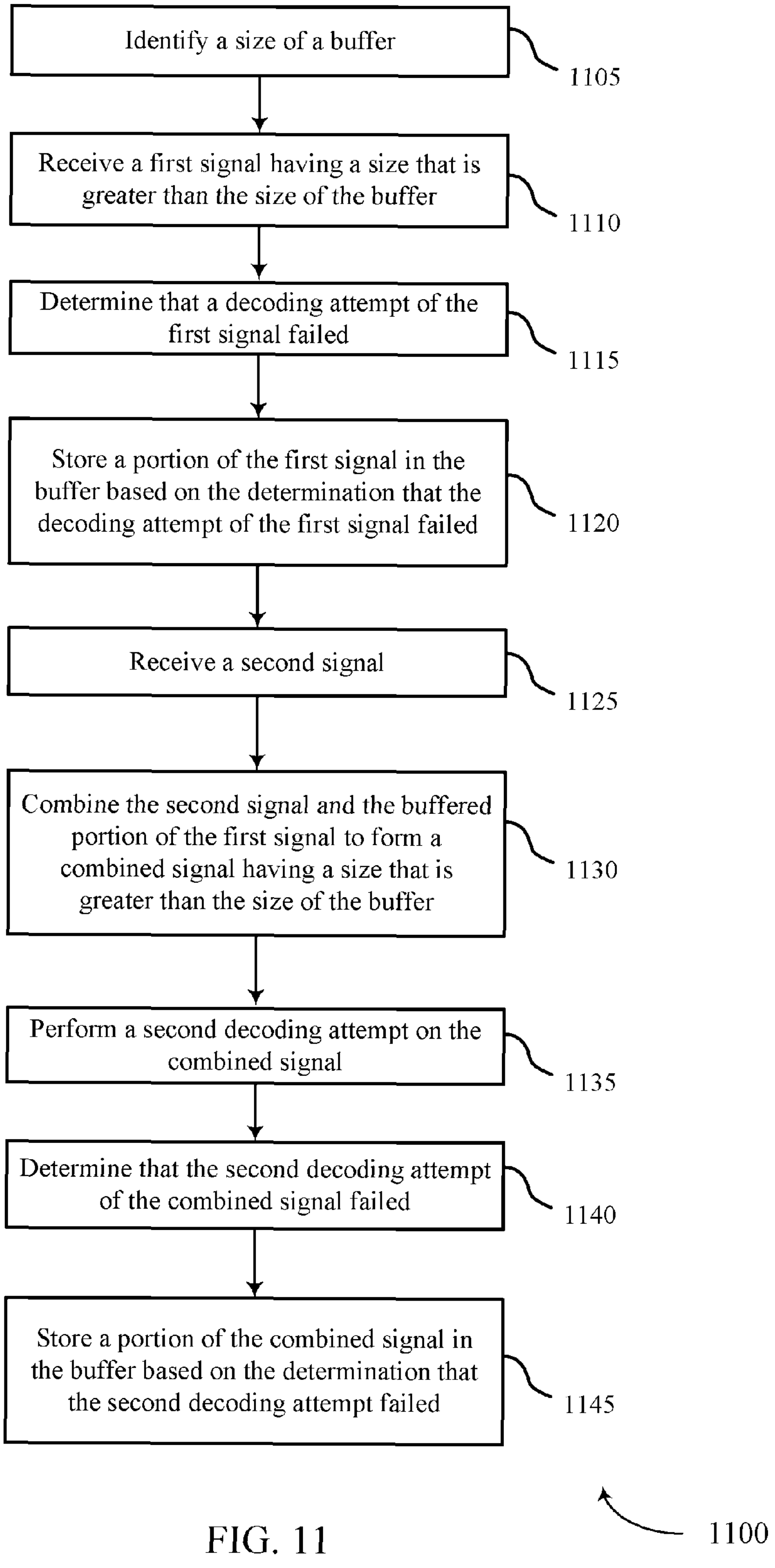

FIG. 11 shows a flowchart illustrating a method 1100 for soft HARQ in accordance with various aspects of the present disclosure. The operations of method 1100 may be implemented by a UE 115 or its components as described with reference to FIGS. 1-8. For example, the operations of method 1100 may be performed by the soft HARQ module 510 as described with reference to FIGS. 5-8. In some examples, a UE 115 may execute a set of codes to control the functional elements of the UE 115 to perform the functions described below. Additionally or alternatively, the UE 115 may perform aspects the functions described below using special-purpose hardware. The method 1100 may also incorporate aspects of methods 900, and 1000 of FIGS. 9-10.

At block 1105, the UE 115 may identify a size of a buffer as described with reference to FIGS. 2-4. In certain examples, the operations of block 1105 may be performed by the buffer module 605 as described with reference to FIG. 6.

At block 1110, the UE 115 may receive a first signal having a size that is greater than the size of the buffer as described with reference to FIGS. 2-4. In certain examples, the operations of block 1110 may be performed by the signaling module 610 as described with reference to FIG. 6.

At block 1115, the UE 115 may determine that a decoding attempt of the first signal failed as described with reference to FIGS. 2-4. In certain examples, the operations of block 1115 may be performed by the signal decode module 615 as described with reference to FIG. 6.

At block 1120, the UE 115 may store a portion of the first signal in the buffer, a size of the portion being less than or equal to the size of the buffer and stored based on the determination that the decoding attempt of the first signal failed as described with reference to FIGS. 2-4. In certain examples, the operations of block 1120 may be performed by the signal storage module 620 as described with reference to FIG. 6.

At block 1125, the UE 115 may receive a second signal as described with reference to FIGS. 2-4. In certain examples, the operations of block 1125 may be performed by the signaling module 610 as described with reference to FIG. 6.

At block 1130, the UE 115 may combine the second signal and the buffered portion of the first signal to form a combined signal having a combined signal size that is greater than the size of the buffer as described with reference to FIGS. 2-4. In certain examples, the operations of block 1130 may be performed by the signal combination module 705 as described with reference to FIG. 7.

At block 1135, the UE 115 may perform a second decoding attempt on the combined signal as described with reference to FIGS. 2-4. In certain examples, the operations of block 1135 may be performed by the signal decode module 615 as described with reference to FIG. 6.

At block 1140, the UE 115 may determine that the second decoding attempt of the combined signal failed as described with reference to FIGS. 2-4. In certain examples, the operations of block 1140 may be performed by the signal decode module 615 as described with reference to FIG. 6.

At block 1145, the UE 115 may store a portion of the combined signal in the buffer based on the determination that the second decoding attempt failed, the portion of the combined signal having a combined signal size that is less than or equal to the size of the buffer as described with reference to FIGS. 2-4. In certain examples, the operations of block 1145 may be performed by the signal storage module 620 as described with reference to FIG. 6.

Figure 12:
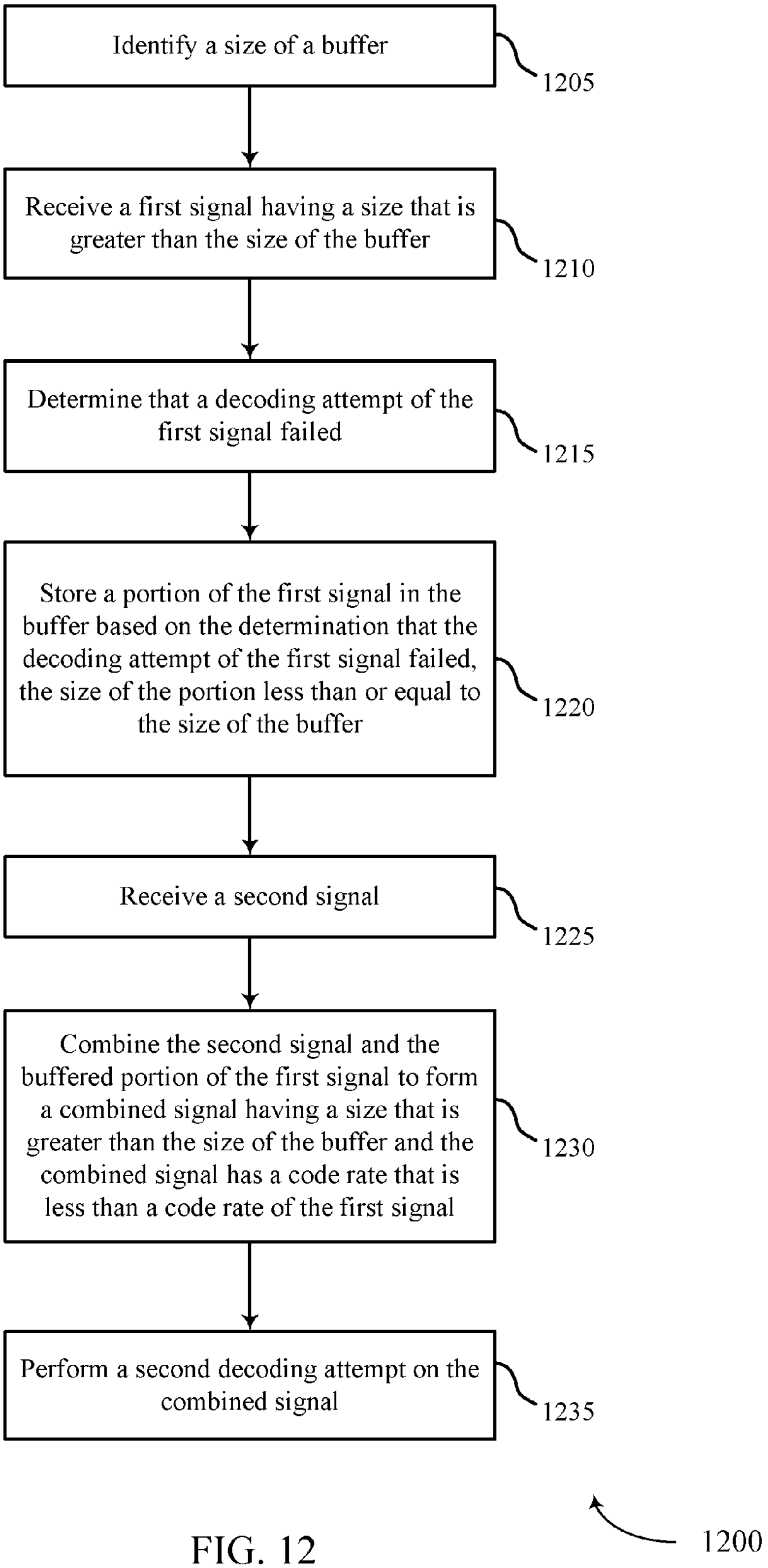

FIG. 12 shows a flowchart illustrating a method 1200 for soft HARQ in accordance with various aspects of the present disclosure. The operations of method 1200 may be implemented by a UE 115 or its components as described with reference to FIGS. 1-8. For example, the operations of method 1200 may be performed by the soft HARQ module 510 as described with reference to FIGS. 5-8. In some examples, a UE 115 may execute a set of codes to control the functional elements of the UE 115 to perform the functions described below. Additionally or alternatively, the UE 115 may perform aspects the functions described below using special-purpose hardware. The method 1200 may also incorporate aspects of methods 900, 1000, and 1100 of FIGS. 9-11.

At block 1205, the UE 115 may identify a size of a buffer as described with reference to FIGS. 2-4. In certain examples, the operations of block 1205 may be performed by the buffer module 605 as described with reference to FIG. 6.

At block 1210, the UE 115 may receive a first signal having a size that is greater than the size of the buffer as described with reference to FIGS. 2-4. In certain examples, the operations of block 1210 may be performed by the signaling module 610 as described with reference to FIG. 6.

At block 1215, the UE 115 may determine that a decoding attempt of the first signal failed as described with reference to FIGS. 2-4. In certain examples, the operations of block 1215 may be performed by the signal decode module 615 as described with reference to FIG. 6.

At block 1220, the UE 115 may store a portion of the first signal in the buffer, a size of the portion being less than or equal to the size of the buffer and stored based on the determination that the decoding attempt of the first signal failed as described with reference to FIGS. 2-4. In certain examples, the operations of block 1220 may be performed by the signal storage module 620 as described with reference to FIG. 6.

At block 1225, the UE 115 may receive a second signal as described with reference to FIGS. 2-4. In certain examples, the operations of block 1225 may be performed by the signaling module 610 as described with reference to FIG. 6.

At block 1230, the UE 115 may combine the second signal and the buffered portion of the first signal to form a combined signal having a combined signal size that is greater than the size of the buffer as described with reference to FIGS. 2-4. The combined signal may have a code rate that is less than a code rate of the first signal. In certain examples, the operations of block 1230 may be performed by the signal combination module 705 as described with reference to FIG. 7.

At block 1235, the UE 115 may perform a second decoding attempt on the combined signal as described with reference to FIGS. 2-4. In certain examples, the operations of block 1235 may be performed by the signal decode module 615 as described with reference to FIG. 6.

Thus, methods 900, 1000, 1100, and 1200 may provide for soft HARQ. It should be noted that methods 900, 1000, 1100, and 1200 describe possible implementation, and that the operations and the steps may be rearranged or otherwise modified such that other implementations are possible. In some examples, aspects from two or more of the methods 900, 1000, 1100, and 1200 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms “system” and “network” are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are new releases of Universal Mobile Telecommunications System (UMTS) that use E-UTRA. UTRA, E-UTRA, Universal Mobile Telecommunications System (UMTS), LTE, LTE-A, and Global System for Mobile communications (GSM) are described in documents from an organization named “3rd Generation Partnership Project” (3GPP). CDMA2000 and UMB are described in documents from an organization named “3rd Generation Partnership Project 2” (3GPP2). The techniques described herein may be used for the systems and radio technologies mentioned above as well as other systems and radio technologies. The description herein, however, describes an LTE system for purposes of example, and LTE terminology is used in much of the description above, although the techniques are applicable beyond LTE applications.

In LTE/LTE-A networks, including such networks described herein, the term evolved node B (eNB) may be generally used to describe the base stations. The wireless communications system or systems described herein may include a heterogeneous LTE/LTE-A network in which different types of evolved node B (eNBs) provide coverage for various geographical regions. For example, each eNB or base station may provide communication coverage for a macro cell, a small cell, or other types of cell. The term “cell” is a 3GPP term that can be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies). Each modulated signal may be sent on a different sub-carrier and may carry control information (e.g., reference signals, control channels, etc.), overhead information, user data, etc. The communication links described herein (e.g., communication links 125 of FIG. 1) may transmit bidirectional communications using frequency division duplex (FDD) (e.g., using paired spectrum resources) or time division duplex (TDD) operation (e.g., using unpaired spectrum resources). Frame structures may be defined for frequency division duplex (FDD) (e.g., frame structure type 1) and TDD (e.g., frame structure type 2).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of wireless communication, comprising:

receiving, at a user equipment (UE), a first signal comprising a first set of bits, the first set of bits having a size that is greater than a bit capacity size of a buffer in the UE;

determining, at the UE, that a first decoding attempt of the first set of bits failed; and storing, at the UE, a portion of the first set of bits in the buffer based at least in part on the determination that the first decoding attempt of the first set of bits failed and the bit capacity size of the buffer, wherein a size of the portion of the first set of bits is less than or equal to the bit capacity size of the buffer.

2. The method of claim 1, further comprising:

receiving a second signal comprising a second set of bits;

combining the second set of bits and the stored portion of the first set of bits to form a combined set of bits having a size that is greater than the size of the bit capacity size of the buffer; and performing a second decoding attempt on the combined set of bits.

3. The method of claim 2, further comprising:

determining that the second decoding attempt of the combined set of bits failed; and storing a portion of the combined set of bits in the buffer based at least in part on the determination that the second decoding attempt failed, the portion of the combined set of bits having a size that is less than or equal to the bit capacity size of the buffer.

4. The method of claim 3, wherein the stored portion of the combined set of bits comprises a systematic information portion and a first parity portion of the first set of bits or a second parity portion of the second set of bits, or both.

5. The method of claim 3, further comprising:

selecting the portion of the combined set of bits for storing based at least in part on a signal-to-noise ratio (SNR).

6. The method of claim 5, wherein selecting the portion of the combined set of bits for storing comprises:

identifying a systematic information or parity portion, or both, for storing based at least in part on a relative SNR of the second set of bits and the first set of bits.

7. The method of claim 2, wherein combining the second set of bits and the stored portion of the first set of bits comprises:

soft-combining systematic information and parity information portions of the first and second sets of bits.

8. The method of claim 2, wherein the combined set of bits comprises a systematic information portion, a first parity portion based at least in part on the first set of bits, and a second parity portion based at least in part on the second set of bits.

9. The method of claim 2, wherein the second set of bits is combined with the stored portion of the first set of bits without storing the second set of bits prior to the combining.

10. The method of claim 2, further comprising:

receiving signaling indicative of whether the second set of bits comprises a systematic information portion or a parity portion, or both.

11. The method of claim 1, wherein the first set of bits comprises a coded information portion and parity portion.

12. The method of claim 1, wherein the buffer comprises a log-likelihood ratio (LLR) buffer.

13. The method of claim 1, wherein receiving the first signal comprises:

receiving a downlink data channel of a plurality of component carriers (CCs).

14. The method of claim 1, wherein the bit capacity size of the buffer is less than a size of a system transport block size at a lowest code rate.

15. A user equipment (UE) for wireless communication, comprising:

means for receiving, at the UE, a first signal comprising a first set of bits having a size that is greater than a bit capacity size of a buffer;

means for determining, at the UE, that a first decoding attempt of the first set of bits failed; and means for storing, at the UE, a portion of the first set of bits in the buffer based at least in part on the determination that the first decoding attempt of the first set of bits failed and the bit capacity size of the buffer, wherein a size of the portion of the first set of bits is less than or equal to the bit capacity size of the buffer.

16. A user equipment (UE) for wireless communication, comprising:

a processor;

a buffer having a bit capacity size;

memory in electronic communication with the processor; and instructions stored in the memory and operable, when executed by the processor, to cause the UE to: receive, at the UE, a first signal comprising a first set of bits having a size that is greater than the bit capacity size of the buffer;

determine, at the UE, that a first decoding attempt of the first set of bits failed; and store, at the UE, a portion of the first set of bits in the buffer based at least in part on the determination that the first decoding attempt of the first set of bits failed and the bit capacity size of the buffer, wherein a size of the portion of the first set of bits is less than or equal to the bit capacity size of the buffer.

17. The UE of claim 16, wherein the instructions are operable to cause the UE to:

receive a second signal comprising a second set of bits;

combine the second set of bits and the stored portion of the first set of bits to form a combined set of bits having a size that is greater than the bit capacity size of the buffer; and perform a second decoding attempt on the combined set of bits.

18. The UE of claim 17, wherein the instructions are operable to cause the UE to:

determine that the second decoding attempt of the combined set of bits failed; and store a portion of the combined set of bits in the buffer based at least in part on the determination that the second decoding attempt failed, the portion of the combined set of bits having a size that is less than or equal to the bit capacity size of the buffer.

19. The UE of claim 18, wherein the stored portion of the combined set of bits comprises a systematic information portion and a first parity portion of the first signal or a second parity portion of the second set of bits, or both.

20. The UE of claim 18, wherein the instructions are operable to cause the UE to:

select the portion of the combined set of bits for storing based at least in part on a signal-to-noise ratio (SNR).

21. The UE of claim 20, wherein the instructions are operable to cause the UE to:

identify a systematic information or parity portion, or both, for storing based at least in part on a relative SNR of the second set of bits and the first set of bits.

22. The UE of claim 17, wherein the instructions are operable to cause the UE to:

soft-combine systematic information portions of the first and second sets of bits.

23. The UE of claim 17, wherein the combined set of bits comprises a systematic information portion, a first parity portion based at least in part on the first set of bits, and a second parity portion based at least in part on the second set of bits.

24. The UE of claim 17, wherein the instructions are operable to cause the UE to:

combine the second set of bits with the stored portion of the first set of bits without storing the second set of bits prior to the combining.

25. The UE of claim 17, wherein the instructions are operable to cause the UE to:

receive signaling indicative of whether the second set of bits comprises a systematic information portion or a parity portion, or both.

26. The UE of claim 16, wherein the first set of bits comprises a coded information portion and parity portion.

27. The UE of claim 16, wherein the buffer comprises a log-likelihood ratio (LLR) buffer.

28. The UE of claim 16, wherein receiving the first signal comprises:

receiving a downlink data channel of a plurality of component carriers (CCs).

29. The UE of claim 16, wherein the bit capacity size of the buffer is less than a size of a system transport block size at a lowest code rate.

30. A non-transitory computer-readable medium storing code for wireless communication, the code comprising instructions executable to:

receive, at a user equipment (UE), a first signal comprising a first set of bits having a size that is greater than a bit capacity size of a buffer in the UE;

determine, at the UE, that a first decoding attempt of the first set of bits failed; and store, at the UE, a portion of the first set of bits in the buffer based at least in part on the determination that the first decoding attempt of the first set of bits failed and the bit capacity size of the buffer, wherein a size of the portion of the first set of bits is less than or equal to the bit capacity size of the buffer.

* * * * *